United States Patent
Hwang et al.

(10) Patent No.: US 8,715,472 B2
(45) Date of Patent: *May 6, 2014

(54) SUBSTRATE PROCESSING METHODS FOR REFLECTORS

(75) Inventors: Sung-Wook Hwang, Seoul (KR); Chul-Ho Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 1098 days.

This patent is subject to a terminal disclaimer.

(21) Appl. No.: 12/659,331

(22) Filed: Mar. 4, 2010

(65) Prior Publication Data

US 2010/0190356 A1   Jul. 29, 2010

Related U.S. Application Data

(62) Division of application No. 11/350,795, filed on Feb. 10, 2006, now abandoned.

(30) Foreign Application Priority Data

Mar. 7, 2005   (KR) .................. 10-2005-0018874

(51) Int. Cl.
   *C23C 14/34* (2006.01)

(52) U.S. Cl.
   USPC ............ 204/298.11; 204/298.04; 204/192.12; 204/192.34; 204/192.23; 156/345.3; 156/345.26; 216/66; 216/67; 216/71

(58) Field of Classification Search
   USPC ............ 204/298.11, 298.04, 192.12, 192.34, 204/192.23; 156/345.3, 345.29; 216/67, 71; 250/492.21, 492.2
   See application file for complete search history.

(56) References Cited

U.S. PATENT DOCUMENTS

| | | | |
|---|---|---|---|
| 4,139,879 A | 2/1979 | Laws | 361/230 |
| 4,662,977 A | 5/1987 | Motley et al. | |
| 4,775,789 A | 10/1988 | Albridge et al. | 250/251 |
| 5,296,122 A | 3/1994 | Katsube et al. | 204/298.04 |
| 7,446,325 B2 * | 11/2008 | Hwang et al. | 250/492.21 |

FOREIGN PATENT DOCUMENTS

| | | |
|---|---|---|
| JP | 08-297200 | 11/1996 |
| KR | 1020020039840 | 5/2002 |
| KR | 10-2003-0042958 | 6/2003 |
| KR | 10-2004-0033524 | 4/2004 |
| KR | 1020050001058 | 1/2005 |

OTHER PUBLICATIONS

Korean Office Action dated Jun. 28, 2006.

* cited by examiner

*Primary Examiner* — Keith Hendricks
*Assistant Examiner* — Jason M Berman
(74) *Attorney, Agent, or Firm* — Harness, Dickey & Pierce, PLC

(57) ABSTRACT

A substrate processing method may include forming a plasma; extracting ions from the plasma and accelerating the ions to have uniform or substantially uniform directivity using a grid system; irradiating the ions at a reflector, wherein the reflector includes a plurality of reflecting plates each having a metal plate and an insulating layer on the metal plate, wherein the reflecting plates are parallel or substantially parallel such that the insulating layers are exposed to the ions; reflecting the ions incident on the reflecting plates away from the insulating layers of the reflecting plates; colliding the ions reflected away from the insulating layers with the metal plates to convert the ions into neutral beams; and irradiating the neutral beams onto a substrate to process the substrate.

20 Claims, 5 Drawing Sheets

SUBSTRATE PROCESSING METHODS FOR REFLECTORS

PRIORITY STATEMENT

This application is a divisional of U.S. patent application Ser. No. 11/350,795, filed on Feb. 10, 2006 now abandoned (published as U.S. Patent Application Publication No. 2006/0196425 A1 on Sep. 7, 2006), and claims the associated benefit under 35 U.S.C. §120 and 35 U.S.C. §121. U.S. patent application Ser. No. 11/350,795 claims priority from Korean Patent Application No. 10-2005-0018874, filed on Mar. 7, 2005, in the Korean Intellectual Property Office (KIPO). The entire contents of U.S. patent application Ser. No. 11/350,795, U.S. Patent Application Publication No. 2006/0196425 A1, and Korean Patent Application No. 10-2005-0018874 are incorporated herein by reference.

BACKGROUND

1. Field of the Invention

Example embodiments of the present invention relate semiconductor apparatuses and substrate processing methods, for example, a substrate processing apparatus for converting ions into neutral beams and a method for the same.

2. Description of Related Art

Related art methods for fabricating semiconductor devices may use plasma. For example, plasma may be used for a deposition process, an etching process and/or an annealing process. Thin films may be deposited and/or patterned on a semiconductor wafer and heating processes may be performed. In related art semiconductor device fabrication, a plasma process may be performed using a plasma processing apparatus Related art plasma processing apparatuses may use, for example, a chemical vapor deposition method, a plasma annealing method and/or a dry etching method.

With the increased integration of semiconductor devices, processing conditions of a semiconductor processing apparatuses may be increasingly stricter. As a result, performance of related art plasma processing apparatuses has been continuously improved. For example, a density of the plasma and/or increasing the uniformity of plasma distribution has been improved.

However, plasma may be limited in basic characteristics. For example, plasma may be limited because plasma is a charged particle. The charge of the plasma may cause, for example, transforming a substrate or a surface of a specific material layer of the substrate into an amorphous layer and/or changing a chemical composition of a substrate surface layer. Additionally, a dangling bond may be generated in the substrate surface layer, charge-up damage of a gate insulating layer may be caused and/or electrical damage may be caused by notching of a polysilicon layer due to charging of photoresist.

In the above and other related art methods of semiconductor fabrication, ions in the plasma may be converted into neutral beams. The ions may be neutralized, for example, using a method of colliding ions with neutrons, electrons or a metal plate.

In one example, related art system, plasma may be generated by a plasma gun and reflected by a neutralizing plate to generate the neutral particles. The neutralizing plate may be mounted so as to have an adjustable angle. The ions may be deflected from a scan direction using the neutralizing plate and may be directed toward a substrate to be processed. The substrate to be processed may be mounted in a direction inclined by an angle with respect to an incident direction of the ions incident on the neutralizing plate. In this example, when the semiconductor fabricating process is performed using this system, ensuring process uniformity may be increasingly difficult. For example, when an etching process is performed, it may be difficult to ensure etching uniformity.

SUMMARY OF THE INVENTION

Example embodiments of the present invention provide a reflector including reflecting plates which may be parallel or substantially parallel to one another. Example embodiments of the present invention provide a substrate processing apparatus including a reflector, which may have reflecting plates parallel or substantially parallel to one another. Example embodiments of the present invention provide a substrate processing method using neutral beams.

At least one example embodiment of the present invention provides a reflector, which may include parallel or substantially parallel reflecting plates. Each of the reflecting plates may have a metal plate and an insulating layer stacked on the metal plate. The reflecting plates may be parallel or substantially parallel so that the insulating layer may be exposed to incident ions.

In at least some example embodiments of the present invention, the metal plate may be formed of, for example, iron (Fe), Nickel (Ni), aluminum (Al), tantalum (Ta), Molybdenum (Mo), platinum (Pt), gold (Au), tungsten (W), silicon (Si), stainless or an alloy thereof. The insulating layer may be formed of, for example, a silicon oxide layer or an oxide layer of a material forming the metal plate. The reflecting plates may be arranged obliquely at an angle of about 1° to about 45°, inclusive, relative to the incident ions. For example, the reflecting plates may be arranged obliquely at an angle of about 3° to about 15°, inclusive, relative to the incident ions.

In at least some example embodiments of the present invention, the incident ions may be incident on and reflected from the insulating layers of the reflecting plates by Coulomb repulsion without substantial collision, and the incident ions may be converted into neutral beams by collision with metal plates facing the insulating layers of the reflecting plates. The neutral beams may have the same or substantially the same directivity as the ions incident to the insulating layers of the reflecting plates.

Another example embodiment of the present invention provides a substrate processing apparatus. The substrate processing apparatus may include a plasma generating unit arranged in an upper region of a processing chamber. A grid system, which may extract ions from plasma formed by the plasma generating unit and accelerate the ions to have uniform or substantially uniform directivity, may be positioned below the plasma generating unit. A reflector may be arranged below the grid system. The reflector may include parallel or substantially parallel reflecting plates for converting the ions accelerated from the grid system into neutral beams. Each of the reflecting plates may include a metal plate and an insulating plate stacked on the metal plate. A substrate support for fixing a substrate to which the neutral beams are incident may be arranged in a lower region of the processing chamber.

In at least some example embodiments of the present invention, a shutter system may be positioned between the substrate and the reflector.

Another example embodiment of the present invention provides a substrate processing method. In a substrate processing method according to an example embodiment of the present invention, a first plasma may be formed in the processing chamber. Preliminary ions may be extracted from the first plasma and accelerated to have uniform or substantially uniform directivity using a grid system. The preliminary ions may be irradiated onto a reflector. The reflector may include parallel or substantially parallel reflecting plates, and each of the reflecting plates may include a metal plate and an insulating layer stacked on the metal plate. The preliminary ions may collide with the reflecting plates so that a charge build-up occurs on the insulating layers of the reflecting plates. The polarity of the charge build-up may be the same as a polarity of the preliminary ions. A second plasma may be formed in the processing chamber. Process ions may be extracted and accelerated from the second plasma using the grid system. The process ions may be emitted at the reflector. The process ions incident on the reflecting plates in the reflector may be reflected from the insulating layers of the reflecting plates without substantial collision. The reflected process ions may collide with the metal plates and be converted into neutral beams. The neutral beams may be reflected to have the same or substantially the same directivity when emitted by the grid system. The neutral beams may be irradiated onto the substrate to process the substrate.

In at least some example embodiments of the present invention, while the charge build-up occurs on the insulating layers of the metal plates, the substrate may be protected from the preliminary ions by a shutter system positioned between the substrate and the reflector.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
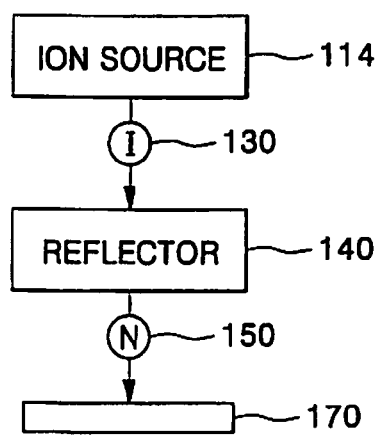
FIG. 1 is a conceptual illustration of a substrate processing apparatus according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 is a conceptual illustration of a substrate processing apparatus according to an example embodiment of the present invention.

Referring to FIG. 1, ions 130 may be incident on a reflector 140. The ions 130 may have uniform or substantially uniform directivity and may be emitted from an ion source 114. The ion source 114 may be, for example, plasma, a plasma ion source, or the like. The ions 130 may be converted into neutral beams 150 by the reflector 140. In at least this example embodiment, the neutral beams 150 may have the same or substantially the same directivity as the ions 130 incident on the reflector 140. The neutral beams 150 may be incident on a substrate 170 to be processed.

Figure 2:
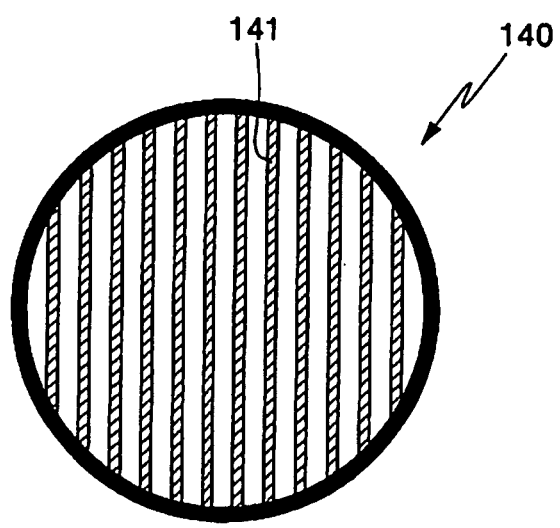
FIG. 2 is a plan view of a reflector according to an example embodiment of the present invention.
Figure 3:
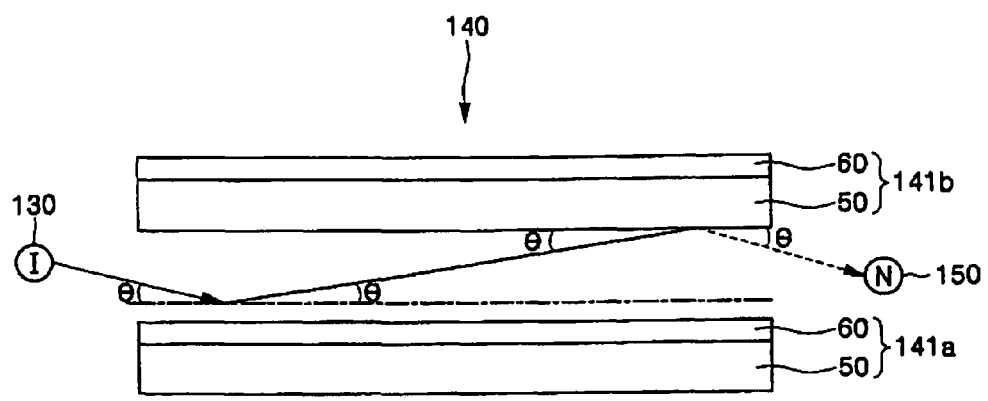
FIG. 3 is a schematic diagram illustrating a method for converting ions to neutral beams according to an example embodiment of the present invention.

FIG. 2 is a plan view of a reflector shown according to an example embodiment of the present invention and FIG. 3 is a schematic diagram illustrating a method for converting ions to neutral beams according to an example embodiment of the present invention. In FIG. 3, a path of the ions 130 is denoted by a solid line and a path of the neutral beams 150 is denoted by a dotted line.

Referring to FIGS. 1 through 3, the reflector 140 may have a plurality of parallel or substantially parallel reflecting plates 141a and 141b. The reflecting plates 141a and 141b may be arranged obliquely in one or more frames. For example, the reflector 140 may include the plurality of parallel or substantially parallel reflecting plates 141a and 141b arranged obliquely at an interval (e.g., a regular interval) in the frame. The frame may be, for example, a columnar pipe or the like. The reflector 140 may have a grill shape, as shown, for example, in FIG. 2; although the reflector 140 may have any suitable shape. In at least this example embodiment, each of the reflecting plates 141a and 141b may include a metal plate 50 and/or an insulating layer 60 stacked thereon. The metal plate 50 may be formed of, for example, iron (Fe), Nickel (Ni), aluminum (Al), tantalum (Ta), Molybdenum (Mo), platinum (Pt), gold (Au), tungsten (W), silicon (Si), stainless steel, an alloy thereof or any suitable metallic material including elements and/or alloys having similar, or substantially similar, metallic and/or other properties.

The insulating layer 60 may be formed of a silicon oxide layer, an oxide layer of a material which forms the metal plate 50 or any other suitable oxide layer with similar or substantially similar properties. The reflecting plates 141a and 141b may be arranged obliquely such that the insulating layers 60 of the reflectors 141a and 141b are exposed to the ions 130. The ions 130 may have uniform or substantially uniform directivity and may be incident on the reflector 140.

The path of the ions 130 passing through the reflector 140 may propagate between two reflecting plates 141a and 141b, as shown in FIG. 3. In this example, the ions 130 may first contact and/or be reflected from the reflecting plate 141a (referred to hereinafter as the first reflecting plate 141a). The ions 130 reflected from the first reflecting plate 141a may contact the reflecting plate 141b (hereinafter referred to as the second reflecting plate 141b). However, these plates may be interchangeable.

The ions 130 having uniform or substantially uniform directivity and being incident on the reflector 140 may be reflected from the insulating layer 60 of the first reflecting plate 141a without substantial collision (e.g., with little or no collision) and may collide with the metal plate 50 of the second reflecting plate 141b to be converted into the neutral beams 150. Before the ions 130 are incident on the reflector 140, a charge build-up may occur on the insulating layer 60. For example, before the ions 130 are incident on the reflector 140, preliminary ions having the same polarity as the ions 130 may be incident on the reflector 140 so that charge build-up may occur on the insulating layer 60. When the preliminary ions are irradiated onto the insulating layer 60, the insulating layer 60 may be charged with charges (e.g., accumulate a charge) having the same polarity as the preliminary ions. The ions 130 irradiated onto the first reflecting plate 141a may be reflected according to Coulomb's law.

For example, the ions 130 having the same polarity as the charges of the insulating layer 60 may be reflected by Coulomb repulsion. As a result, the ions 130 may be reflected without colliding (e.g., directly colliding, direct collision, etc.) with the first reflecting plate 141a. In this example, the ions 130 may be reflected by an incident angle θ of the first reflecting plate 141a. The ions 130 reflected from the first reflecting plate 141a may collide with the metal plate 50 of the second reflecting plate 141b to be converted into the neutral beams 150. In this example, the neutral beams 150 may have the same or substantially the same directivity as the ions incident on the reflector 140, as shown in FIG. 3.

The path of the ions converted into the neutral beams while passing between the reflecting plates 141a and the reflecting plates 141b will be described in detail with reference to FIG. 4.

Figure 4:
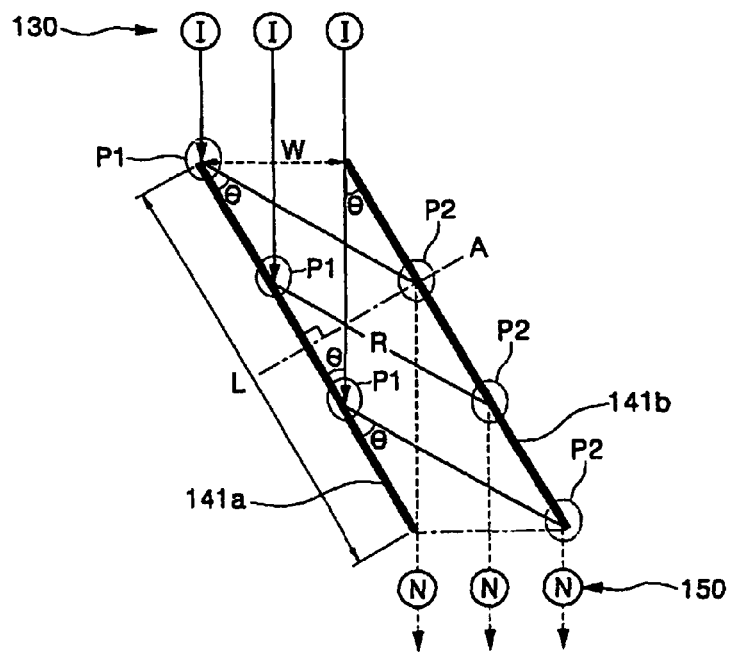
FIG. 4 is a schematic diagram illustrating a path of the ions passing through the reflector and reflecting plates in the reflector according to an example embodiment of the present invention.

As shown in FIG. 4, two adjacent reflecting plates 141a and 141b will be described. The two reflecting plates 141a and 141b may be referred to as the first reflecting plate 141a and the second reflecting plate 141b, respectively, as described in FIG. 3.

Referring to FIG. 4, the parallel reflecting plates 141a and 141b may be arranged obliquely at a uniform or substantially uniform angle relative to the ions 130 having the uniform or substantially uniform directivity. When the incident angle of the ions 130 incident on a surface of the first reflecting plate 141a is θ and a horizontal distance between an exposed surface of the insulating layer of the first reflecting plate 141a and an exposed surface of the metal plate of the second reflecting plate 141b is 'w', a length 'L' of each of the reflecting plates 141a and 141b may be determined using Equation 1.

$$L = 2R \cos \theta \qquad \text{(Equation 1)}$$

In Equation 1, R denotes a distance from a point P1 on which the ions 130 may be reflected from the first reflecting plate 141a to a point P2 on which the ions 130 may collide with the second reflecting plate 141b. R may be determined using Equation 2.

$$R = \frac{w}{\tan\theta} \qquad \text{(Equation 2)}$$

In Equation 2, the incident angle θ of the ions 130 incident on the surface of the first reflecting plate 141a may be, for example, about 1° to about 45°, inclusive. In another example, the incident angle θ may be about 3° to about 15°, inclusive. When the ions 130 are vertically or substantially vertically incident, the reflecting plates 141 may be arranged obliquely at the same or substantially the same angle as the incident angle θ shown in FIG. 4. "A", as shown in FIG. 4 is a normal line perpendicular to the second reflecting plate 141b at the point P2 on which the ions 130 may collide with and may be reflected from the second reflecting plate 141b. For example, the normal line "A" denotes a straight line perpendicular to the second reflecting plate 141b at the point P2 on which one ion reflected from an upper (e.g., uppermost) side of the first reflecting plate 141a may collide with and/or may be reflected from the second reflecting plate 141b. In this example, the normal line "A" may bisect (e.g., halve) or substantially bisect the first reflecting plate 141a thereby deriving Equation 1.

The ions 130 passing through the reflector including the reflecting plates 141a and 141b may be converted into the neutral beams 150, for example, by two reflections and a collision. For example, as described with reference to FIG. 3, the ions 130 may be reflected from the insulating layer of the first reflecting plate 141a according to Coulomb's law without substantial collision, collide with the metal plate of the second reflecting plate 141b and may be converted into the neutral beams and reflected from the metal plate of the second reflecting plate 141b.

Because the ions may be reflected from the insulating layer of the first reflecting plate 141a according to Coulomb's law without substantial collision, energy loss of the ions reflected from the insulating layer of the first reflecting plate 141a and/or distribution expansion of the ions may be reduced (e.g., minimized). Because the ions may not collide or substantially collide with the first reflecting plate 141a, heat generated in the first reflecting plate 141a may be reduced (e.g., minimized). This may suppress deformation and/or damage of the first reflecting plate 141a as a result of heat. The ions irradiated onto the metal plate of the second reflecting plate 141b may have the same or substantially the same distribution as the ions which may be incident on the insulating layer of the first reflecting plate 141a. As a result, the energy loss generated when the ions 130 pass between the reflecting plates 141a and 141b to be converted into the neutral beams may be reduced (e.g., minimized) and/or uniform or substantially uniform neutral beams may be obtained. The neutral beams 150 may have the same or substantially same directivity as ions 130 incident on the reflector 140, as shown in FIG. 4.

In another example, if the length L of one or more (e.g., each) of the reflecting plates 141a and 141b is magnified n times, the ions 130 may be reflected in the reflector 140 2n times. In this example, 'n' is a positive integer.

Figure 5:
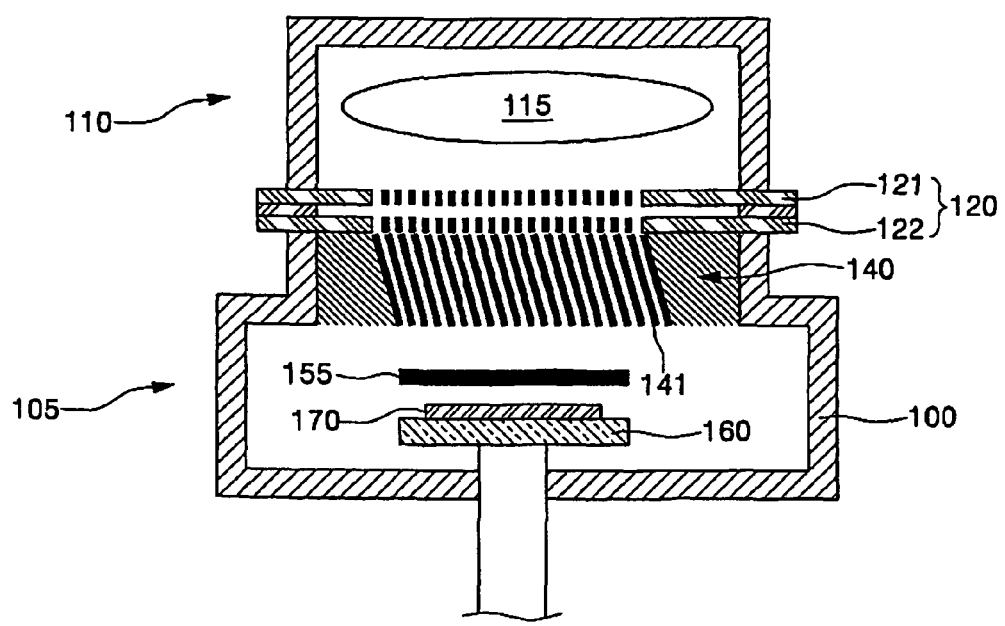
FIG. 5 illustrates a structure of a substrate processing apparatus according to an example embodiment of the present invention.

FIG. 5 illustrates a structure of a substrate processing apparatus according to an example embodiment of the present invention.

Referring to FIG. 5, the substrate processing apparatus according to an example embodiment of the present invention may include a processing chamber 100. A space or an apparatus for forming plasma 115 may be provided at an upper region 110 of the processing chamber 100. The plasma 115 may be formed of capacitive coupled plasma (CCP), electron cyclotron plasma (ECR plasma), helicon plasma, inductivity coupled plasma (ICP), or any modified plasma suitable for use in one or more substrate processes.

A substrate support 160 for fixing a substrate 170 to be processed may be arranged at a lower region 105 of the processing chamber 100. A grid system 120 for extracting and accelerating the ions from the plasma 115 may be provided between the upper region 110 and the lower region 105. The grid system 120 may include a first grid unit 121 having a first penetrating hole and a second grid unit 122 having a second penetrating hole. The first and second penetrating holes may be connected (e.g., communicated) with each other. Voltages of different polarities may be applied to the first grid unit 121 and the second grid unit 122. The ions may be extracted and accelerated from first plasma 115a by a potential difference between the first grid unit 121 and the second grid unit 122. A third grid (not shown) may be provided below the second grid unit 122. The third grid unit may be used to maintain the directivity of the extracted preliminary ions and may be grounded.

A reflector 140 as described above with reference to FIGS. 2 through 4 may be arranged below the grid system 120. The reflector 140 may include a plurality of parallel or substantially parallel reflecting plates 141 arranged obliquely in a frame. For example, the reflector 140 may include reflecting plates 141 arranged obliquely at a desired (e.g., a regular interval) in the frame. The frame may be, for example, a columnar pipe or the like.

Each of the reflecting plates 141 may include a metal plate 50 and an insulating layer 60 stacked on the metal plate 50. The metal plate 50 may be formed of iron (Fe), Nickel (Ni), aluminum (Al), tantalum (Ta), Molybdenum (Mo), platinum (Pt), gold (Au), tungsten (W), silicon (Si), stainless steel, an alloy thereof or any suitable metallic material including elements and/or alloys having similar, or substantially similar, metallic and/or other properties. The insulating layer 60 may be formed of a silicon oxide layer, an oxide layer of a material which forms the metal plate 50 or any other suitable oxide material with similar or substantially similar properties. The ions 130 incident to the reflector 140 may have the same or substantially same directivity as the neutral beams 150 converted through the reflector 140, as described with reference to FIGS. 3 and 4.

In one or more example embodiments of the present invention, the space for forming the plasma 115, the grid system 120 for extracting and accelerating the ions from the plasma 115, the reflector 140 and/or the substrate support 160 may be arranged vertically or substantially vertical. For example, the substrate processing apparatus employing the reflector described with reference to FIGS. 2 through 4 may be fabricated and/or arranged vertically or substantially vertical. This may result in a more easily fabricated and/or managed substrate processing apparatus.

In another example, in order to suppress (e.g., prevent) deformation and/or damage to the substrate 170 is deformed and/or damaged by neutral beams and/or preliminary ions, a shutter system 155 may be arranged between the reflector 140 and the substrate 170. The shutter system 155 may be used to suppress (e.g., prevent) incidence of the neutral beams on the substrate 170 to be processed.

Figure 6:
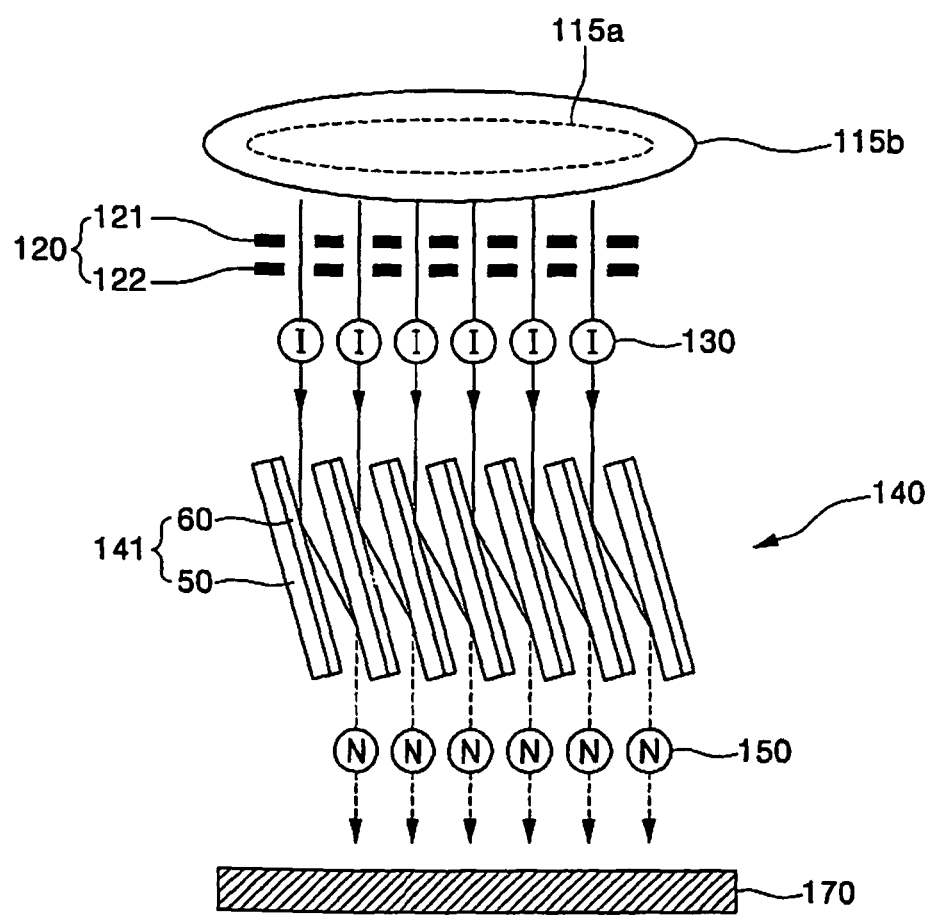
FIG. 6 is a schematic diagram illustrating a substrate processing method according to an example embodiment of the present invention.
Figure 7:
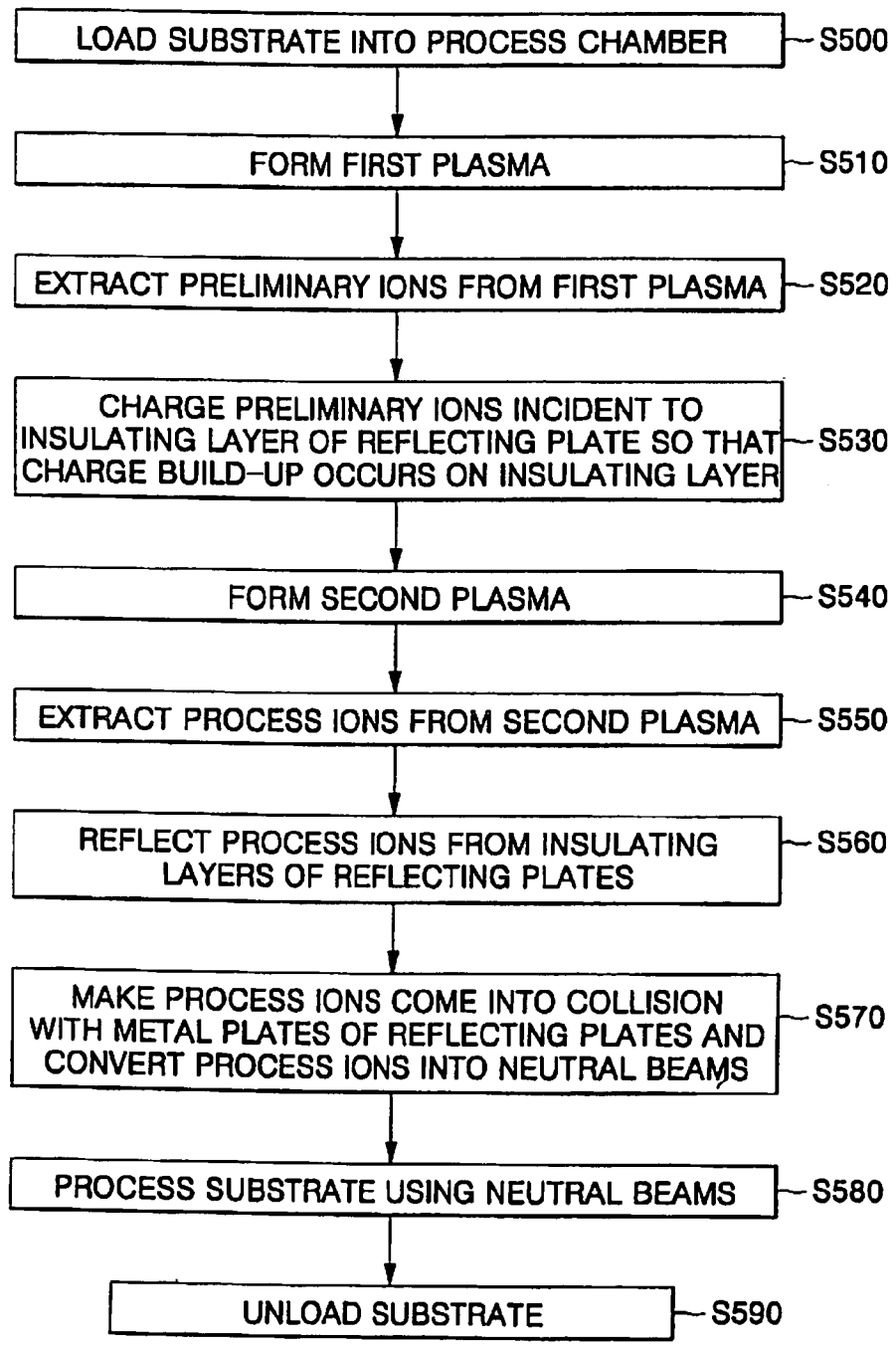
FIG. 7 is a flowchart illustrating the substrate processing method according to an example embodiment of the present invention.

FIG. 6 is a schematic diagram illustrating a substrate processing method, according to an example embodiment of the present invention, and FIG. 7 is a flowchart illustrating the substrate processing method according to an example embodiment of the present invention. A method of processing a substrate, according to an example embodiment of the present invention, as illustrated in FIGS. 6 and 7, will be described with reference to FIG. 5.

Referring to FIGS. 5, 6, and 7, the substrate 170 may be loaded on the substrate support 160 into the process chamber 100 (S500). A first plasma 115a may be formed in the upper region 110 of the process chamber 100 (S510). The first plasma 115a may be formed using any suitable conventional method. For example, the first plasma 115a may be capacitive coupled plasma (CCP), electron cyclotron plasma (ECR plasma), helicon plasma, inductivity coupled plasma (ICP), or any plasma or modified plasma suitable for use in each process. The first plasma 115a may be formed so that a charge build-up may occur on the insulating layer 60 of the reflecting plate 141.

The preliminary ions may be extracted and accelerated from the first plasma 115a using the grid system 120 (S520). The grid system 120 may include a first grid unit 121 having a first penetrating hole and a second grid unit 122 having a second penetrating hole. The first and second penetrating holes may be connected (e.g., communicated) with each other. Voltages of different polarities may be applied to the first grid unit 121 and the second grid unit 122 so that the ions may be extracted and accelerated from first plasma 115a by a potential difference between the first grid unit 121 and the second grid unit 122. The preliminary ions extracted and accelerated by the grid system 120 may have the same or substantially the same directivity (e.g., unidirectivity or substantial unidirectivity). A third grid (not shown) may be further provided below the second grid unit 122. The third grid unit may maintain the directivity of the extracted preliminary ions. The third grid unit may be grounded.

The preliminary ions extracted and accelerated using the grid system 120 may have similar or substantially similar energy (e.g., regular or substantially regular energy) and may be directed to the reflector 140. In one or more example embodiments, the preliminary ions may be directed to the reflector 140 and may have an energy of, for example, about 1 eV to about 50 eV, inclusive.

The reflector 140 may include parallel or substantially parallel reflecting plates 141 arranged obliquely in a frame as described with reference to FIGS. 2 through 4. Each of the reflecting plates 141 may include a metal plate 50 and an insulating layer 60 stacked on the metal plate 50. The metal plate 50 may be formed of iron (Fe), Nickel (Ni), aluminum (Al), tantalum (Ta), Molybdenum (Mo), platinum (Pt), gold (Au), tungsten (W), silicon (Si), stainless steel, an alloy thereof or any suitable metallic material including elements and/or alloys having similar, or substantially similar, metallic and/or other properties. The insulating layer 60 may be formed of a silicon oxide layer, an oxide layer of a material which forms the metal plate 50 or any other oxide material with similar or substantially similar properties.

The reflecting plates 141 may be arranged obliquely such that the insulating layers 60 of the reflectors 141 may be exposed to the ions 130 having uniform or substantially uniform directivity and may be incident on the reflector 140. In one or more example embodiment, the reflecting plates 141 may be arranged obliquely at an angle of about 1° to about 45°, inclusive, relative to the preliminary ions, as described with reference to FIG. 4. In one example, the reflecting plates 141 may be arranged obliquely at an angle of about 3° to about 15°, inclusive, relative to the preliminary ions.

The preliminary ions incident on the reflector 140 may charge the insulating layer 60 of the reflecting plates 141 so that a charge build-up may occur as described with reference to FIG. 3 (S530). Because the preliminary ions passing through the reflector 140 may be converted into the neutral beams and incident on the substrate 170, the likelihood that the substrate 170 to be processed is deformed and/or damaged by the neutral beams may be reduced (e.g., prevented). This may result in preliminary ions having weaker energy, for example, energy of about 1 eV to about 50 eV, inclusive.

In another example embodiment, in order to reduce the likelihood of (e.g., prevent) deformation and/or damage to the substrate 170, a shutter system 155 may be arranged or provided between the reflector 140 and the substrate 170. The shutter system may suppress (e.g., prevent) neutral beams incident on the substrate 170.

A second plasma 115b may be formed in the upper region 110 of the processing chamber 100 (S540). The second plasma 115b may include process ions 130 for processing the substrate 170. In one or more example embodiments of the present invention, the first plasma 115a and the second plasma 115b may be formed from same or substantially the same plasma source (e.g., a plasma source gas). For example, the second plasma 115b may be the plasma which is formed (e.g., continuously) from the first plasma 115a. The first plasma 115a may be formed so that the charge build-up occurs on the insulating layer 60. For example, the first plasma 115a may be formed so that only the charge build-up occurs on the insulating layer 60. In this example, the first plasma 115a may include inert ions. The inert ions may be, for example, argon ions (Ar+), nitrogen ions, or any other suitable inert ion. The second plasma 115b may be formed using the same or substantially same method as the first plasma 115a.

The process ions 130 may be extracted and accelerated from the second plasma 115b using the grid system 120 (S550). The process ions 130 extracted and accelerated using the grid system 120 may be directed at the reflector 140. As described with reference to FIGS. 2 through 4, the process ions 130 incident on the reflector 140 may be converted into the neutral beams 150 by one or more collisions and may have the same or substantially the same directivity as the ions 130 accelerated from the grid system 120. For example, the process ions 130 may be reflected from the insulating layers 60 of the reflecting plates 141 according to Coulomb's law without substantial collision (e.g., with little or no collision) with the reflecting plates 141, as described with reference to FIGS. 3 and 4 (S560).

The ions 130 reflected from the insulating layers 60 of the reflecting plates 141 may collide with and be reflected by the metal plates 50 facing the insulating layers of the reflecting plates 141 to be converted into the neutral beams 150 (S570).

In this example, the reflecting plates 141 having a certain slope to the preliminary ions and the process ions 130 extracted and accelerated from the first plasma 115a and the second plasma 115b may be arranged obliquely at an angle of about 1° to about 45°, inclusive. In order to reduce (e.g., minimize) space occupied by the reflector 140 in the process chamber 100, the lengths of the reflecting plates 141 of the reflector 140 may be reduced. The reflecting plates 141 may be disposed at a slope of about 3° or more. The heat and the sputtering of the metal plate 50, which may be generated when the process ions 130, may be converted into the neutral beams 150 by the collision with the metal plate 50 may be reduced (e.g., minimized) and the reflecting plates 141 may be disposed at a slope of about 15° or less so that the energy loss of the process ions 130 generated by the collision with the metal plate 50 may be reduced (e.g., minimized). For example, the reflecting plates 141 may be disposed at a slope of about 3° to about 15°, inclusive.

The substrate 170 may be processed using the neutral beams 150 (S580). As described with reference to FIG. 4, the ions 130 may be converted into uniform or substantially uniform neutral beams 150 by passing through the reflector 140. The neutral beams 150 may be perpendicular or substantially perpendicular to the substrate 170 to be processed. The process uniformity at the time of the process of the substrate 170 using the neutral beams 150 may be improved. The substrate 170 may be processed variably according to the type of neutral beams 150. The second plasma 115b may be formed by various plasma source gases, and the second plasma 115b suitable for a desired process may be formed and then the process ions 130 extracted and accelerated from the second plasma 115b may be converted into the neutral beams through the reflector 140. As a result, various kinds of neutral beams 150 may be formed. The semiconductor fabricating processes such as etching, deposition, ashing, ion implantation and any other fabricating process may be performed using the neutral beams 150. The substrate 170 processed using the neutral beams 150 may be unloaded (S590).

As described above, according to example embodiments of the present invention, the ions extracted and accelerated from the plasma may be converted into neutral beams by one or more collisions in the reflector having the reflecting plates. Accordingly, the energy loss which may be generated when the ions are converted into the neutral beams may be reduced (e.g., minimized), uniform or substantially uniform neutral beams may be obtained and/or heat generated in the reflecting plates may be reduced (e.g., minimized). Because the ions incident on the reflector and the neutral beams formed through the reflector have the same or substantially the same directivity, the substrate processing apparatus using the reflector may be vertically arranged and/or fabricated vertically or substantially vertical and/or more easily fabricated and/or managed. The process uniformity at the time of processing the substrate using the substrate processing apparatus may also or alternatively be improved.

What is claimed is:

1. A substrate processing method, comprising:
   forming a first plasma;
   extracting preliminary ions from the first plasma and accelerating the preliminary ions to have uniform or substantially uniform directivity using a grid system;
   irradiating the preliminary ions at a reflector, wherein the reflector comprises a plurality of reflecting plates each having a metal plate and an insulating layer stacked on the metal plate, wherein the reflecting plates are parallel or substantially parallel such that the insulating layers are exposed to the preliminary ions;
   colliding the preliminary ions with the reflecting plates so that a charge build-up occurs on the insulating layers, wherein the polarity of the charge build-up is the same as a polarity of the preliminary ions;
   forming a second plasma;
   extracting and accelerating process ions from the second plasma using the grid system;
   emitting the process ions at the reflector;
   reflecting the process ions incident on the reflecting plates away from the insulating layers of the reflecting plates without substantial collision;
   colliding the process ions reflected away from the insulating layers with the metal plates to convert the process ions into neutral beams;
   reflecting the neutral beams to have substantially a same directivity; and
   irradiating the neutral beams onto a substrate to process the substrate.

2. The method of claim 1, wherein the reflecting plates are arranged obliquely, at an angle greater than or equal to about 1° and less than or equal to about 45°, relative to the ions accelerated by the grid system.

3. The method of claim 1, wherein the reflecting plates are arranged obliquely, at an angle greater than or equal to about 3° and less than or equal to about 15°, relative to the ions accelerated by the grid system.

4. The method of claim 1, wherein the metal plates are formed of iron (Fe), nickel (Ni), aluminum (Al), tantalum (Ta), molybdenum (Mo), platinum (Pt), gold (Au), tungsten (W), silicon (Si), stainless steel, or an alloy thereof.

5. The method of claim 1, wherein the insulating layers are formed of a silicon oxide layer or an oxide layer of a material forming the metal plates.

6. The method of claim 1, wherein while the charge build-up occurs on the insulating layers of the metal plates, the substrate is protected from the preliminary ions by a shutter system provided between the substrate and the reflector.

7. A substrate processing method, comprising:
   forming a plasma;
   extracting ions from the plasma and accelerating the ions to have uniform or substantially uniform directivity using a grid system;
   irradiating the ions at a reflector, wherein the reflector comprises a plurality of reflecting plates each having a metal plate and an insulating layer on the metal plate, wherein the reflecting plates are parallel or substantially parallel such that the insulating layers are exposed to the ions;
   reflecting the ions incident on the reflecting plates away from the insulating layers of the reflecting plates;
   colliding the ions reflected away from the insulating layers with the metal plates to convert the ions into neutral beams; and
   irradiating the neutral beams onto a substrate to process the substrate.

8. The method of claim 7, wherein the metal plate is formed of iron (Fe), nickel (Ni), aluminum (Al), tantalum (Ta), molybdenum (Mo), platinum (Pt), gold (Au), tungsten (W), silicon (Si), stainless steel, or an alloy thereof.

9. The method of claim 7, wherein the insulating layers are formed of a silicon oxide layer or an oxide layer of a material forming the metal plates.

10. The method of claim 7, wherein the neutral beams have the same or substantially the same directivity as the ions incident to the insulating layers of the reflecting plates.

11. A substrate processing method, comprising:
    forming an ion source;
    extracting ions from the ion source and accelerating the ions;
    irradiating the ions at a reflector, wherein the reflector comprises a plurality of reflecting plates each having a first layer and a second layer on the first layer, wherein the reflecting plates are parallel or substantially parallel such that the second layers are exposed to the ions;
    reflecting the ions incident on the reflecting plates away from the second layers of the reflecting plates;
    colliding the ions reflected away from the insulating layers with the first layer to convert the ions into neutral beams, wherein the neutral beams have the same or substantially the same directivity as the ions incident to the second layers of the reflecting plates; and
    irradiating the neutral beams onto a substrate to process the substrate.

12. The method of claim 11, wherein the first layers are formed of metal layers.

13. The method of claim 11, wherein the second layers are formed of an insulating layers.

14. The method of claim 11, wherein the ions are reflected in the reflector 2×n times, and
    wherein "n" is a positive integer.

15. The method of claim 1, wherein the reflecting plates are arranged obliquely, at an angle greater than or equal to about 3°, relative to the ions accelerated by the grid system.

16. The method of claim 1, wherein the reflecting plates are arranged obliquely, at an angle less than or equal to about 1520, relative to the ions accelerated by the grid system.

17. The method of claim 7, wherein the reflecting plates are arranged obliquely, at an angle greater than or equal to about 120 and less than or equal to about 45°, relative to the ions accelerated by the grid system.

18. The method of claim 7, wherein the reflecting plates are arranged obliquely, at an angle greater than or equal to about 3° and less than or equal to about 15°, relative to the ions accelerated by the grid system.

19. The method of claim 7, wherein the reflecting plates are arranged obliquely, at an angle greater than or equal to about 3°, relative to the ions accelerated by the grid system.

20. The method of claim 7, wherein the reflecting plates are arranged obliquely, at an angle less than or equal to about 15°, relative to the ions accelerated by the grid system.

* * * * *